(12) United States Patent
Huang et al.

(10) Patent No.: US 8,979,372 B2
(45) Date of Patent: Mar. 17, 2015

(54) CIRCUIT BOARD AND MANUFACTURING METHOD THEREOF AND ELECTRO-OPTIC APPARATUS HAVING THE CIRCUIT BOARD

(71) Applicant: Unimicron Technology Corp., Taoyuan (TW)

(72) Inventors: Pei-Chang Huang, Taoyuan County (TW); Wen-Fang Liu, Taoyuan County (TW); Cheng-Po Yu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 13/776,737

(22) Filed: Feb. 26, 2013

(65) Prior Publication Data

US 2014/0119688 A1 May 1, 2014

(30) Foreign Application Priority Data

Nov. 1, 2012 (TW) .............................. 101140584 A

(51) Int. Cl.
*G02B 6/12* (2006.01)
*H05K 3/46* (2006.01)
(52) U.S. Cl.
CPC ................ *G02B 6/12* (2013.01); *H05K 3/4626* (2013.01)
USPC .......................................................... 384/14

(58) Field of Classification Search
CPC ............................ G02B 6/4204; G02B 6/4214
See application file for complete search history.

(56) References Cited

U.S. PATENT DOCUMENTS

| 6,996,305 | B2 * | 2/2006 | Kim et al. | 385/15 |
| 7,212,698 | B2 * | 5/2007 | Bapst et al. | 385/14 |
| 7,437,030 | B2 * | 10/2008 | Asai et al. | 385/14 |
| 2007/0183718 | A1 * | 8/2007 | Bae et al. | 385/47 |
| 2008/0262326 | A1 | 10/2008 | Hete et al. | |

* cited by examiner

*Primary Examiner* — Omar R Rojas
(74) *Attorney, Agent, or Firm* — Jianq Chyun IP Office

(57) ABSTRACT

A circuit board, a manufacturing method thereof, and an electro-optic apparatus having the circuit board are provided. The circuit board includes a substrate including a first dielectric layer and a first circuit layer disposed thereon, a waveguide layer disposed on a portion of the substrate, a second dielectric layer, a convex structure and a second circuit layer. The second dielectric layer is disposed on the substrate and the waveguide layer. The second dielectric layer has an opening exposing the sidewall of the waveguide layer and a portion of the first circuit layer. The convex structure is disposed on the sidewall of the waveguide layer. The convex structure and the waveguide layer respectively have refractive index n1 and n2, and $|n1-n2|/n1<1\%$. The surface roughness of the convex structure is less than that of the sidewall of the waveguide layer. The second circuit layer is disposed on the second dielectric layer.

15 Claims, 3 Drawing Sheets

CIRCUIT BOARD AND MANUFACTURING METHOD THEREOF AND ELECTRO-OPTIC APPARATUS HAVING THE CIRCUIT BOARD

CROSS-REFERENCE TO RELATED APPLICATION

This application claims the priority benefit of Taiwan application serial no. 101140584, filed on Nov. 1, 2012. The entirety of the above-mentioned patent application is hereby incorporated by reference herein and made a part of this specification.

BACKGROUND OF THE INVENTION

1. Field of the Invention

The invention relates to a circuit board, a manufacturing method thereof, and an electro-optic apparatus, and more particularly, to a circuit board connecting to an electro-optic device, a manufacturing method thereof, and an electro-optic apparatus having the circuit board.

2. Description of Related Art

With the increase in information capacity, in addition to communication fields such as trunk lines and access systems, the information processing in routers and servers are also currently using light interconnection techniques. In particular, circuit boards having optical transmission paths are developed to transmit light for the short-range signals between or inside the boards of routers and servers. In terms of the optical transmission path, waveguides have higher degrees of freedom than optical fibers in wiring, and waveguides may be densely packed.

In general, the manufacturing method of a circuit board having an optical transmission path includes first forming a waveguide layer on the substrate having a circuit pattern. Then, forming the needed dielectric layers and other circuit patterns on the substrate by the build-up technique. Then, forming openings exposing the sidewalls of the waveguide layer in the dielectric layer on the substrate to form the light entrance and the light exit on the two ends of the waveguide layer. When the electro-optic device is connected to the circuit board, optical signals may enter the waveguide layer through the light entrance and exit the waveguide layer through the light exit.

In the current manufacturing method, laser cutting or mechanical drilling is usually used to form the opening. However, when forming an opening with laser cutting or mechanical drilling, the sidewalls of the waveguide layer usually have significant surface roughness. In this way, when the optical signal enters the waveguide layer through the light entrance and exits the waveguide layer through the light exit, the optical signal is significantly depleted, affecting the performance of the apparatus.

SUMMARY OF THE INVENTION

The invention provides a circuit board that may be used to connect to an electro-optic device.

The invention additionally provides a manufacturing method of a circuit board that manufactures a circuit board used to connect to an electro-optic device.

The invention further provides an electro-optic apparatus having lower optical signal strength depletion.

The invention provides a circuit board including a substrate including a first dielectric layer and a first circuit layer disposed thereon, a waveguide layer, a second dielectric layer, a convex structure and a second circuit layer. The waveguide layer is disposed on a portion of the substrate. The second dielectric layer is disposed on the substrate and the waveguide layer. The second dielectric layer has an opening exposing the sidewall of the waveguide layer and a portion of the first circuit layer. The convex structure is disposed on the sidewall of the waveguide layer. The second circuit layer is disposed on the second dielectric layer.

According to the circuit board of an embodiment of the invention, the convex structure has a refractive index n1, the waveguide layer has a refractive index n2, and |n1−n2|/n1<1%. The surface roughness of the convex structure is less than the surface roughness of the sidewall of the waveguide layer.

According to the circuit board in an embodiment of the invention, the material of the convex structure is, for instance, a polymer material, and the glass transition temperature, Tg is, for instance, less than or equal to the glass transition temperature of the waveguide layer.

According to the circuit board in an embodiment of the invention, the waveguide layer, for instance, covers a portion of the first circuit layer.

The invention further provides a manufacturing method of a circuit board. The method first provides a substrate, and the substrate includes a first dielectric layer and a first circuit layer disposed thereon. Then, the waveguide layer is formed on a portion of the substrate. Then, the second dielectric layer and the conductive layer are laminated on the substrate, wherein the second dielectric layer is disposed between the substrate and the conductive layer. Then, the conductive layer is patterned to form a second circuit layer. Then, an opening is formed in the second dielectric layer, wherein the opening exposes the sidewall of the waveguide layer and a portion of the first circuit layer. Then, a convex structure is formed on the sidewall of the waveguide layer.

According to the manufacturing method of circuit boards in an embodiment of the invention, the method of forming the convex structure on the sidewall of the waveguide layer includes, for instance, first forming a convex structure with injection molding process. Then, the convex structure is disposed on the sidewall of the waveguide layer.

According to the manufacturing method of circuit boards in an embodiment of the invention, the method of forming the opening is, for instance, laser cutting, milling machine processing, or mechanical drilling.

According to the manufacturing method of circuit boards in an embodiment of the invention, the method of forming the convex structure on the sidewall of the waveguide layer includes, for instance, first forming a colloid material on the sidewall of the waveguide layer with dispensing process. Then, heat treatment is applied to the colloid material.

According to the manufacturing method of circuit boards in an embodiment of the invention, the waveguide layer, for instance, covers a portion of the first circuit layer.

The invention further provides an electro-optic apparatus including the above-mentioned circuit board, a connector, and an electro-optic device. The connector and the circuit board are electrically connected, and a portion of the connector is disposed on the opening. The connector has a reflecting surface, and the reflecting surface is next to the convex structure on the sidewall of the waveguide layer. The electro-optic device is disposed on the connector, and is electrically connected to the connector. The light emitted from the electro-optic device is reflected to travel toward the convex structure through the reflecting surface of the connector.

Based on the above, in the circuit board of the invention, a convex structure is disposed on the sidewall of the waveguide layer, and the surface roughness of the convex structure is less than the surface roughness of the sidewall of the waveguide layer, therefore the optical signal strength depletion may be effectively reduced when the optical signal enters or exits the waveguide layer through the convex structure. Moreover, since the refractive index of the convex structure and the refractive index of the waveguide layer have only a small difference or do not have a difference, the transmission path of the optical signal is not affected.

In order to make the aforementioned features and advantages of the invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
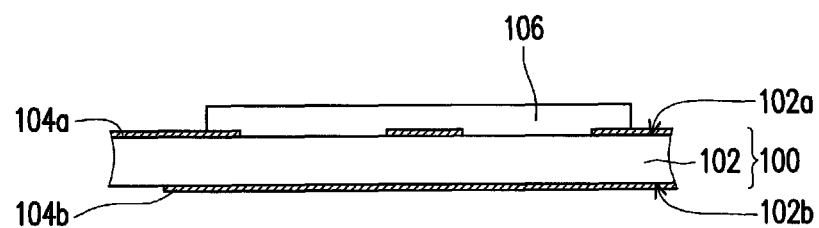
FIG. 1A to FIG. 1D are cross-sectional schematic diagrams of the process flow of a circuit board according to an embodiment of the invention.

FIG. 1A to FIG. 1D are schematic cross-sectional diagrams of a process flow of a circuit board according to an embodiment of the invention. First, referring to FIG. 1A, a substrate 100 is provided. The substrate 100 includes a first dielectric layer 102 and a circuit layer disposed on the first dielectric layer. In the embodiment, the first dielectric layer 102 has an upper surface 102a and a lower surface 102b opposing each other, a first circuit layer 104a is disposed on the upper surface 102a, and a first circuit layer 104b is disposed on the lower surface 102b. Then, a waveguide layer 106 is formed on a portion of the substrate 100. The material of the waveguide layer 106 is, for instance, silicon-based resin, acrylic, epoxy resin, polyimide, light-curable resin, thermoplastic resin, or glass fiber-reinforced resin, but the invention is not limited thereto. The method of forming the waveguide layer 106 includes, for instance, first forming a waveguide material layer on the upper surface 102a of the first dielectric layer 102 by coating or laminating. Then, the waveguide material layer is patterned. In the embodiment, the waveguide layer 106 is disposed on a portion of the first dielectric layer 102 and on a portion of the first circuit layer 104a, but the invention is not limited thereto. In other embodiments, the waveguide layer 106 may also be disposed only on a portion of the first dielectric layer 102 or be disposed only on a portion of the first circuit layer 104a.

Figure 1B:
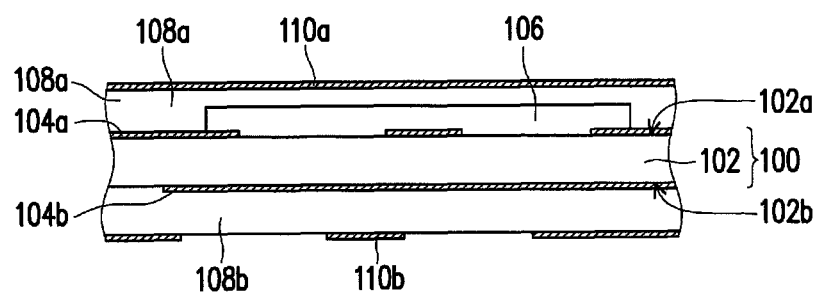

Then, referring to FIG. 1B, a dielectric layer and a conductive layer are laminated on the substrate 100, and the dielectric layer is disposed between the substrate 100 and the conductive layer. In the embodiment, the desired circuit board is a circuit board having four layers of circuit layers, therefore a second dielectric layer 108a and a conductive layer (not illustrated) are laminated on the upper surface 102a, and a second dielectric layer 108b and a conductive layer (not illustrated) are laminated on the lower surface 102b. Then, the conductive layer on the second dielectric layers 108a and 108b is patterned to separately form second circuit layers 110a and 110b on the second dielectric layers 108a and 108b. In other embodiments, the build-up technique may be conducted many times to form multiple dielectric layers and multiple circuit layers according to actual demand.

Figure 1C:
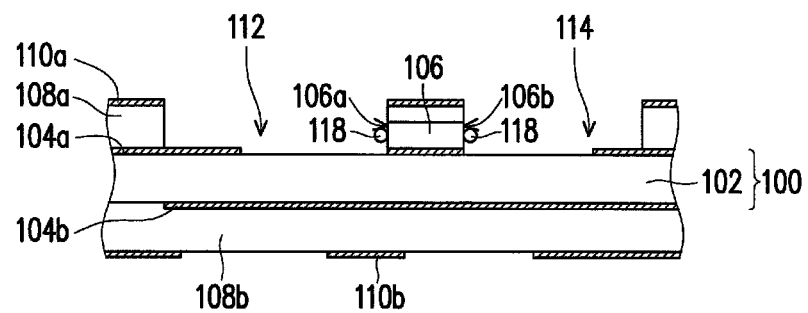

Then, referring to FIG. 1C, openings 112 and 114 are formed in the second dielectric layer 108a. The method of forming the openings 112 and 114 is, for instance, laser cutting, milling machine processing, or mechanical drilling. A portion of the second circuit layer 110a, a portion of the second dielectric layer 108a, and a portion of the waveguide layer 106 are removed during the formation of the openings 112 and 114. In this way, the sidewall of the waveguide layer 106 is exposed. In the embodiment, the opening 112 exposes the left sidewall 106a of the waveguide layer 106, and the opening 114 exposes the right sidewall 106b of the waveguide layer 106. One of the sidewall 106a and the sidewall 106b is used as the light entrance, and another one of the sidewall 106a and the sidewall 106b is used as the light exit. Since the openings 112 and 114 are formed by laser cutting, milling machine processing, or mechanical drilling processes, the exposed sidewalls 106a and 106b have higher surface roughnesses.

In particular, in the embodiment, the waveguide layer 106 is disposed only on a portion of the first circuit layer 104a after forming the openings 112 and 114, but the invention is not limited thereto. In other embodiments, the waveguide layer 106 may also be disposed only on a portion of the first dielectric layer 102 or be simultaneously disposed on a portion of the first circuit layer 104a and on a portion of the first dielectric layer 102.

Referring to FIG. 1C, a dispensing process is conducted on the sidewall 106a and the sidewall 106b of the waveguide layer 106 to form a colloid material 118 on the sidewall 106a and the sidewall 106b. The colloid material is, for instance, a polymer material, and the glass transition temperature of the colloid material is, for instance, less than or equal to the glass transition temperature of the waveguide layer 106. Moreover, the colloid material 118 has a refractive index n1, the waveguide layer 106 has a refractive index n2, and $|n1-n2|/n1<1\%$. That is, the refractive index of the colloid material 118 and the refractive index of the waveguide layer 106 have only a small difference or do not have a difference.

Figure 1D:
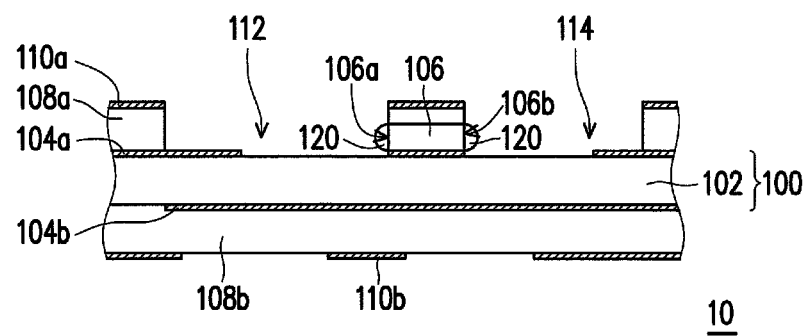

Then, referring to FIG. 1D, a heat treatment is applied to the colloid material 118 to shape the colloid material 118 into a convex structure 120, and to finish the manufacture of the circuit board 10 of the embodiment. To explain in detail, during the heat treatment process of the colloid material 118, the colloid material 118 is gradually shaped into the convex structure 120 having a smooth surface due to the cohesion. That is, the surface roughness of the convex structure 120 formed may be less than the surface roughnesses of the sidewall 106a and the sidewall 106b. In this way, when the optical signal enters the waveguide layer 106 through the convex structure 120, the optical signal strength depletion is effectively reduced, and when the optical signal exits the waveguide layer 106 through the convex structure 120, the optical signal strength depletion is also effectively reduced. Moreover, since the glass transition temperature of the colloid material 118 is less than or equal to the glass transition temperature of the waveguide layer 106, the heat treatment process does not seriously affect the waveguide layer 106. Moreover, since the refractive index of the convex structure 120 and the refractive index of the waveguide layer 106 have only a small difference or do not have a difference, the optical signal is not affected and does not change the transmission path when the optical signal enters the waveguide layer 106 through the convex structure 120 and exits the waveguide layer 106 through the convex structure 120.

In addition, in the embodiment, the convex structure 120 is formed by first forming the colloid material 118 on the sidewall of the waveguide layer 106 by the dispensing process, and then applying heat treatment to the colloid material 118, but the invention is not limited thereto. In other embodiments, the convex structure may also be first formed with injection molding process in an external machine, and then the convex structure is disposed on the sidewall of the waveguide layer.

The following explains the situation after connecting the circuit board 10 to an electro-optic device.

Figure 2:
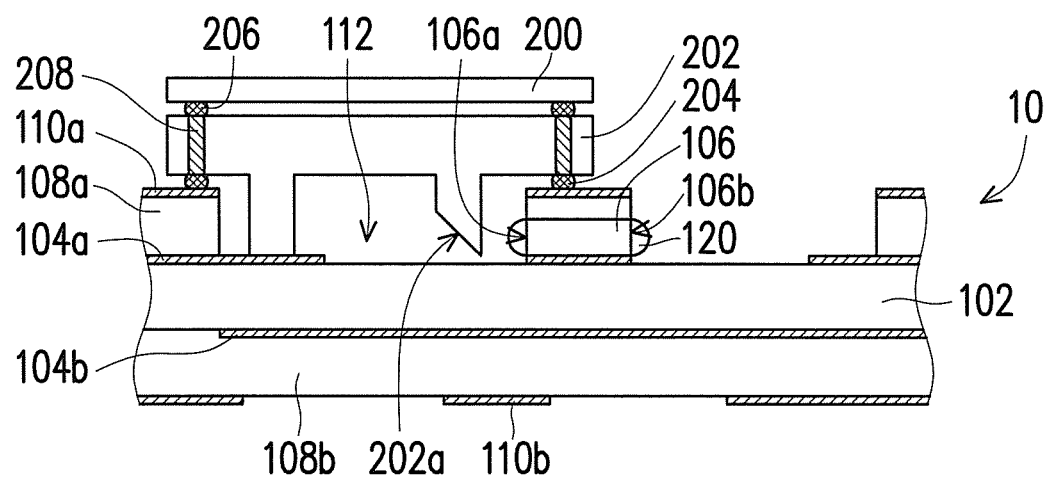
FIG. 2 is a cross-sectional schematic diagram of a circuit board according to an embodiment of the invention connected to an electro-optic device.

FIG. 2 is a cross-sectional schematic diagram of an electro-optic apparatus after connecting a circuit board according to an embodiment of the invention to an electro-optic device. Referring to FIG. 2, a electro-optic device 200 is connected to the circuit board 10 by the solder balls 206, the through vias 208 in a connector 202, and solder balls 204. The electro-optic device 200 is, for instance, a laser light emitter. The connector 202 is electrically connected to the second circuit layer 110a by the solder balls 204, and a portion of the connector 204 is disposed in the opening 112 to electrically connect to the first circuit layer 104a. The connector 202 has a reflecting surface 202a which is disposed next to the convex structure 120 on the sidewall 106a.

In the electro-optic apparatus of the embodiment, the optical signal emitted by the electro-optic device 200 enters the connector 202 from above, and travels towards the convex structure 120 on the sidewall 106a by the reflection of the reflecting surface 202a. Then, the optical signal enters the waveguide layer 106 through the convex structure 120 on the sidewall 106a. Then, the optical signal exits the waveguide layer 106 through the convex structure 120 on the sidewall 106b after passing through the waveguide layer 106. Since the surface roughness of the convex layer 120 is less than the surface roughnesses of the sidewall 106a and the sidewall 106b, the optical signal strength depletion is effectively reduced when the optical signal enters the waveguide layer 106 through the convex structure 120 and exits the waveguide layer 106 through the convex structure 120. Moreover, since the refractive index of the convex structure 120 and the refractive index of the waveguide layer 106 have only a small difference or do not have a difference, the transmission path of the optical signal is not affected.

Although the invention has been described with reference to the above embodiments, it will be apparent to one of the ordinary skill in the art that modifications and variations to the described embodiments may be made without departing from the spirit and scope of the invention. Accordingly, the scope of the invention will be defined by the attached claims not by the above detailed descriptions.

What is claimed is:

1. A circuit board, comprising:
   a substrate comprising a first dielectric layer and a first circuit layer disposed on the first dielectric layer;
   a waveguide layer, disposed on a portion of the substrate;
   a second dielectric layer, disposed on the substrate and covers the waveguide layer, wherein the second dielectric layer has an opening exposing the sidewall of the waveguide layer and a portion of the first circuit layer;
   two convex structures, respectively disposed on the opposing sidewalls of the waveguide layer; and
   a second circuit layer, disposed on the second dielectric layer.

2. The circuit board of claim 1, wherein the convex structure has a refractive index n1, the waveguide layer has a refractive index n2, and |n1−n2|/n1<1%, wherein the surface roughness of the convex structure is less than the surface roughness of the sidewall of the waveguide layer.

3. The circuit board of claim 1, wherein the material of the convex structure comprises a polymer material having a glass transition temperature less than or equal to the glass transition temperature of the waveguide layer.

4. The circuit board of claim 2, wherein the material of the convex structure comprises a polymer material having a glass transition temperature less than or equal to the glass transition temperature of the waveguide layer.

5. The circuit board of claim 1, wherein the waveguide layer covers a portion of the first circuit layer.

6. A manufacturing method of a circuit board, comprising:
   providing a substrate, wherein the substrate comprises a first dielectric layer and a first circuit layer disposed on the first dielectric layer;
   forming a waveguide layer on a portion of the substrate;
   laminating a second dielectric layer and a conductive layer, wherein the second dielectric layer is disposed between the substrate and the conductive layer and covers the waveguide layer;
   patterning the conductive layer to form a second circuit layer;
   forming an opening in the second dielectric layer, wherein the opening exposes the sidewall of the waveguide layer and a portion of the first circuit layer; and
   forming two convex structures respectively on the opposing sidewalls of the waveguide layer.

7. The method of claim 6, wherein the method of forming the convex structure on the sidewall of the waveguide layer comprises:
   applying an injection molding process to form the convex structure; and
   disposing the convex structure on the sidewall of the waveguide layer.

8. The method of claim 6, wherein the method of forming the opening comprises laser cutting, milling machine processing, or mechanical drilling.

9. The method of claim 6, wherein the method of forming the convex structure on the sidewall of the waveguide layer comprises:
   conducting a dispensing process to form a colloid material on the sidewall of the waveguide layer; and
   applying a heat treatment to the colloid material.

10. The method of claim 6, wherein the waveguide layer covers a portion of the first circuit layer.

11. An electro-optic apparatus, comprising:
    the circuit board of claim 1;
    a connector, electrically connected to the circuit board and partially disposed in the opening, wherein the connector has a reflecting surface disposed next to the convex structure on the sidewall of the waveguide layer; and
    an electro-optic device, disposed on the connector and electrically connected to the connector,
    wherein the light emitted from the electro-optic device is reflected to travel toward the convex structure through the reflecting surface of the connector.

12. An electro-optic apparatus, comprising:
    the circuit board of claim 2;
    a connector, electrically connected to the circuit board and partially disposed in the opening, wherein the connector has a reflecting surface disposed next to the convex structure on the sidewall of the waveguide layer; and
    an electro-optic device, disposed on the connector and electrically connected to the connector,
    wherein the light emitted from the electro-optic device is reflected to travel toward the convex structure through the reflecting surface of the connector.

13. An electro-optic apparatus, comprising:
the circuit board of claim 3;
a connector, electrically connected to the circuit board and partially disposed in the opening, wherein the connector has a reflecting surface disposed next to the convex structure on the sidewall of the waveguide layer; and
an electro-optic device, disposed on the connector and electrically connected to the connector,
wherein the light emitted from the electro-optic device is reflected to travel toward the convex structure through the reflecting surface of the connector.

14. An electro-optic apparatus, comprising:
the circuit board of claim 4;
a connector, electrically connected to the circuit board and partially disposed in the opening, wherein the connector has a reflecting surface disposed next to the convex structure on the sidewall of the waveguide layer; and
an electro-optic device, disposed on the connector and electrically connected to the connector,
wherein the light emitted from the electro-optic device is reflected to travel toward the convex structure through the reflecting surface of the connector.

15. An electro-optic apparatus, comprising:
the circuit board of claim 5;
a connector, electrically connected to the circuit board and partially disposed in the opening, wherein the connector has a reflecting surface disposed next to the convex structure on the sidewall of the waveguide layer; and
an electro-optic device, disposed on the connector and electrically connected to the connector,
wherein the light emitted from the electro-optic device is reflected to travel toward the convex structure through the reflecting surface of the connector.

* * * * *